(12) United States Patent
Yang et al.

(10) Patent No.: US 12,268,056 B2
(45) Date of Patent: Apr. 1, 2025

(54) DISPLAY PANEL WITH PIXEL DEFINITION LAYER HAVING DEPRESSION STRUCTURE AND DISPLAY DEVICE INCLUDING THE DISPLAY PANEL

(71) Applicants: Chengdu BOE Optoelectronics Technology Co., Ltd., Sichuan (CN); BOE Technology Group Co., Ltd., Beijing (CN)

(72) Inventors: Bowen Yang, Beijing (CN); Beicih Huang, Beijing (CN); Chengguo An, Beijing (CN); Xiaodong Yang, Beijing (CN); Junjiao Chen, Beijing (CN); Yubin Song, Beijing (CN); Fei Xie, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 136 days.

(21) Appl. No.: 17/764,407

(22) PCT Filed: May 28, 2021

(86) PCT No.: PCT/CN2021/096786
§ 371 (c)(1),
(2) Date: Mar. 28, 2022

(87) PCT Pub. No.: WO2021/258996
PCT Pub. Date: Dec. 30, 2021

(65) Prior Publication Data
US 2023/0329039 A1    Oct. 12, 2023

(30) Foreign Application Priority Data
Jun. 24, 2020    (CN) .......................... 202010584818.8

(51) Int. Cl.
*H10K 59/12*    (2023.01)
*H10K 59/122*    (2023.01)
*H10K 59/173*    (2023.01)

(52) U.S. Cl.
CPC ......... *H10K 59/122* (2023.02); *H10K 59/173* (2023.02)

(58) Field of Classification Search
CPC .......................... H10K 59/122; H10K 59/173
(Continued)

(56) References Cited

U.S. PATENT DOCUMENTS

2016/0071911 A1    3/2016 Lee
2016/0155784 A1    6/2016 Park et al.
(Continued)

FOREIGN PATENT DOCUMENTS

CN    109585688 A    4/2019
CN    109841752 A    6/2019
(Continued)

OTHER PUBLICATIONS

CN 202010584818.8 first office action.
PCT/CN2021/096786 international search report and written opinion.

*Primary Examiner* — Phuc T Dang
(74) *Attorney, Agent, or Firm* — IPro, PLLC

(57) ABSTRACT

The present disclosure provides a display panel and a display device. The display panel includes an array substrate, a first electrode layer, a pixel definition layer, and a luminescent material layer laminated one on another. The pixel definition layer includes a first portion and a second portion, the first portion corresponds to and is arranged in an active area of the display panel, the second portion surrounds the first portion. A depression structure is arranged in the second portion, and an aperture of the depression struc- (Continued)

ture is oriented to a side of the pixel definition layer away from the array substrate.

17 Claims, 3 Drawing Sheets

(58) Field of Classification Search
USPC .......................................................... 257/91
See application file for complete search history.

(56) References Cited

U.S. PATENT DOCUMENTS

| | | | |
|---|---|---|---|
| 2016/0308163 A1* | 10/2016 | Yoon | .................... H10K 59/122 |
| 2018/0342563 A1 | 11/2018 | You et al. | |
| 2019/0097179 A1* | 3/2019 | Shu | ......................... H10K 59/38 |
| 2019/0371865 A1* | 12/2019 | Lee | .................... H10K 59/8792 |
| 2021/0055600 A1* | 2/2021 | Yu | ......................... G02F 1/1339 |
| 2021/0336208 A1 | 10/2021 | Liu et al. | |
| 2021/0408506 A1 | 12/2021 | Wu | |

FOREIGN PATENT DOCUMENTS

| | | | | |
|---|---|---|---|---|
| CN | 105552102 B | 7/2019 | | |
| CN | 209328948 U | 8/2019 | | |
| CN | 110491929 A | 11/2019 | | |
| CN | 110943109 A | 3/2020 | | |
| CN | 111128010 A | 5/2020 | | |
| CN | 111129104 A | * | 5/2020 | ......... H01L 27/3246 |
| CN | 111192974 A | 5/2020 | | |
| CN | 111682053 A | 9/2020 | | |

* cited by examiner

DISPLAY PANEL WITH PIXEL DEFINITION LAYER HAVING DEPRESSION STRUCTURE AND DISPLAY DEVICE INCLUDING THE DISPLAY PANEL

CROSS-REFERENCE TO RELATED APPLICATION

This application is the U.S. national phase of PCT Application No. PCT/CN2021/096786 filed on May 28, 2021, which claims a priority of the Chinese patent application No. 202010584818.8 filed on Jun. 24, 2020, which is incorporated herein by reference in its entirety.

TECHNICAL FIELD

The present disclosure relates to the field of display technology, in particular to a display panel and a display device.

BACKGROUND

Organic light-emitting diode (OLED) display device has such advantages as self-luminous, wide viewing angle, almost infinite contrast ratio, low power consumption, and extremely high reaction rate, and has been widely used in high-end display devices.

In a manufacturing process of the OLED display device, a method of a low-temperature polysilicon backplane plus a fine metal mask (FMM) is a mature technology and is widely used. However, in order to ensure uniformity of a pixel aperture of the FMM during an etching process, an actual aperture size of the FMM needs to be larger than an active area (AA) of a panel. Meanwhile, in order to ensure uniformity of a film thickness of a light-emitting device in an evaporation process, mask ribs for shielding and dividing pixels also need to be larger than the active area of the panel by a certain size. Due to the above two limitations, there is electroluminescent material with an annular shape in a contact range between a periphery of the active area of the panel and the FMM. In the process of replacing the FMM for evaporation, contact friction may occur between the electroluminescent material and the FFM, thereby producing particles, resulting in the problem of product reliability.

Therefore, there is an urgent need to solve the above technical problems.

SUMMARY

An object of the present disclosure is to provide a display panel and a display device with a novel structure.

In one aspect, the present disclosure provides in some embodiments a display panel, including an array substrate, a first electrode layer, a pixel definition layer, and a luminescent material layer laminated one on another. The pixel definition layer includes a first portion and a second portion, the first portion corresponds to and is arranged in an active area of the display panel, the second portion surrounds the first portion, a depression structure is arranged in the second portion, and an opening of the depression structure is oriented to a side of the pixel definition layer away from the array substrate.

In a possible embodiment of the present disclosure, the depression structure surrounds the first portion and is in contact with the first portion.

In a possible embodiment of the present disclosure, the display panel further includes a planarization layer. The planarization layer is arranged between the first electrode layer and the pixel definition layer, the planarization layer is provided with a groove of which an opening is oriented to the pixel definition layer, a surface of the groove is covered with the pixel definition layer, and an orthogonal projection of the depression structure onto the array substrate is within an orthogonal projection of the groove onto the array substrate.

In a possible embodiment of the present disclosure, a section of the depression structure in a direction perpendicular to a display surface of the display panel is of a rectangular shape.

In a possible embodiment of the present disclosure, a depth of the depression structure is 0.1 µm to 1.8 µm.

In a possible embodiment of the present disclosure, a depth of the depression structure is 0.7 µm to 1.8 µm.

In a possible embodiment of the present disclosure, a width of the depression structure in a direction away from the active area is 0.3 mm to 0.5 mm.

In a possible embodiment of the present disclosure, a width of the depression structure is 0.3 mm.

In a possible embodiment of the present disclosure, a plurality of barriers is arranged in the depression structure which is annular, and is spaced apart from each other. A thickness of the barrier is the same as a depth of the depression structure, or a thickness of the barrier is less than a depth of the depression structure.

In a possible embodiment of the present disclosure, there are two or more depression structures, and the two or more depression structures are spaced apart from each other in the second portion in a direction from the first portion to the second portion.

In a possible embodiment of the present disclosure, the display panel further includes: a second electrode layer arranged at a side of the luminescent material layer away from the array substrate; and a packaging layer arrange at a side of the second electrode layer away from the array substrate.

In another aspect, the present disclosure provides in some embodiments a display device, including the above-mentioned display panel.

The above illustration is only an overview of the technical solutions of the present disclosure. In order to make the technical means of the present disclosure more apparent and implement the technical means according to the contents of the description, the present disclosure will be described hereinafter in a clear and complete manner in conjunction with the drawings and embodiments.

DETAILED DESCRIPTION

In order to further illustrate the technical means and effects in the present disclosure to achieve intended purpose, the implementation methods, the structures, the features and the effects of the display panel and the display device in the present disclosure will be described in detail hereinafter in conjunction with the drawings and embodiments. In the following description, different references to "one embodiment" or "an embodiment" do not necessarily refer to the same embodiment. Furthermore, the particular features, structures, or characteristics of one or more embodiments may be combined in any suitable manner.

Figure 1:
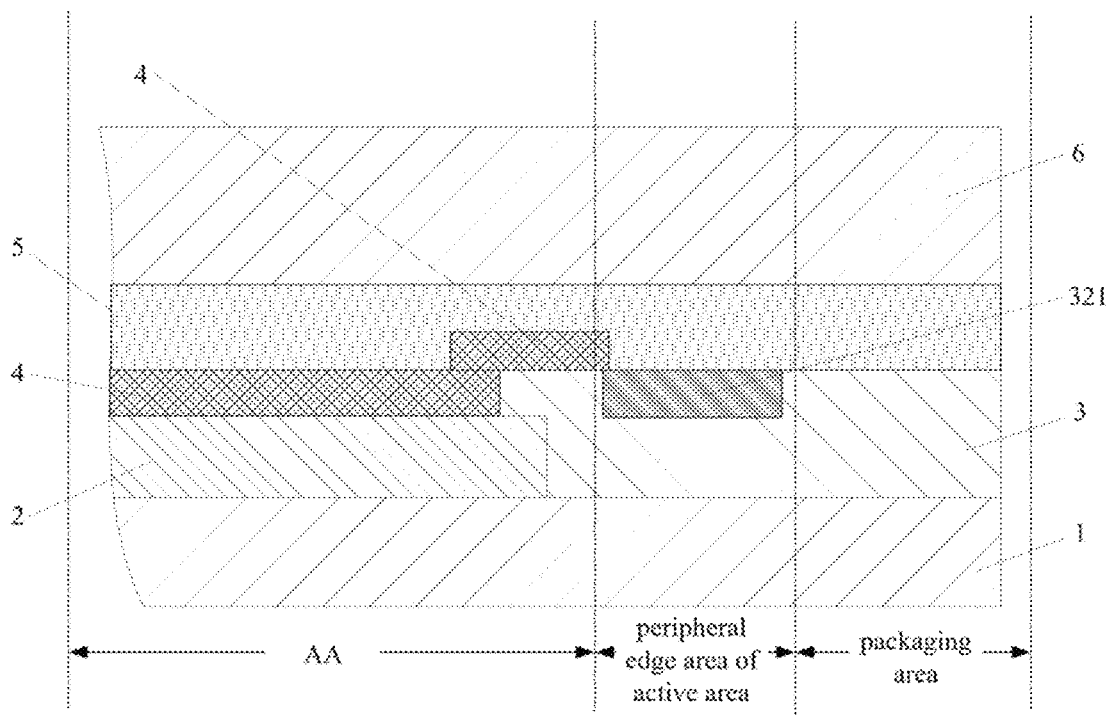
FIG. 1 is a sectional view of a display panel according to one embodiment of the present disclosure.
Figure 2:
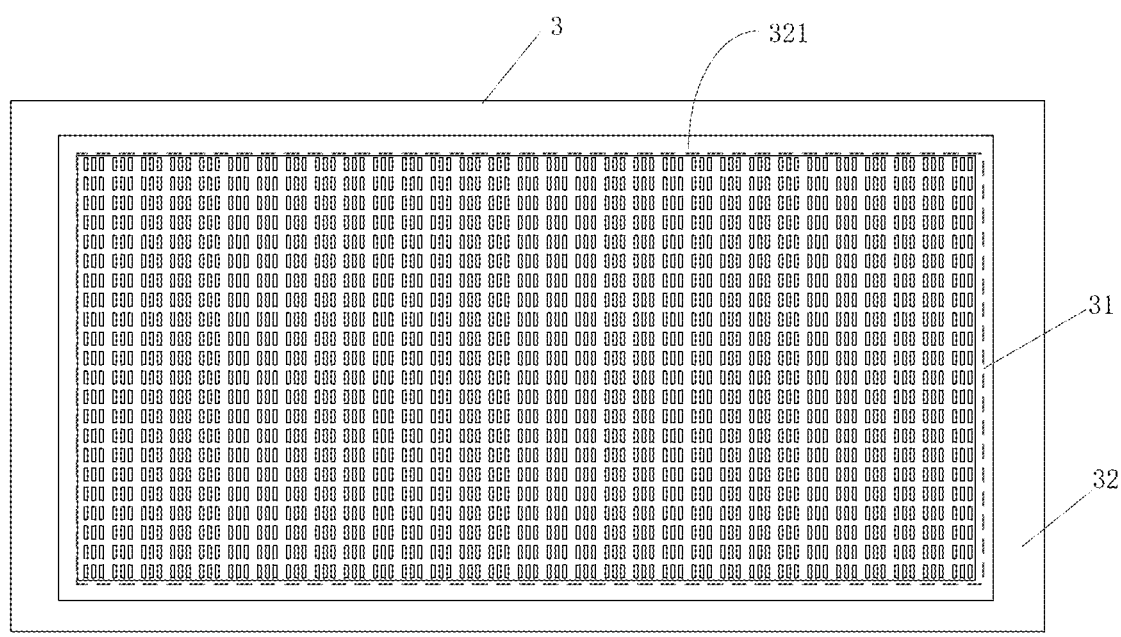
FIG. 2 is a top view of a pixel definition layer of a display panel according to one embodiment of the present disclosure.

As shown in FIG. 1 and FIG. 2, the present disclosure provides in some embodiments a display panel, including an array substrate 1, a first electrode layer 2, a pixel definition layer 3, a luminescent material layer 4, a second electrode layer 5 and a packaging layer 6 laminated one on another.

The pixel definition layer 3 includes a first portion 31 and a second portion 32. The first portion 31 corresponds to and is arranged in an active area of the display panel. The second portion 32 surrounds the first portion 31. A depression structure 321 is arranged in the second portion 32. An opening of the depression structure 321 is oriented to a side of the pixel definition layer 3 away from the array substrate 1. The depression structure 321 surrounds the first portion 31 and is in contact with the first portion 31.

Specifically, in the embodiments of the disclosure, the display penal may be a passive matrix OLED (PMOLED) or an active matrix OLED (AMOLED).

In the embodiments of the disclosure, the display panel may be in a form of top light emission or bottom light emission, a first electrode may be an anode or a cathode, and a second electrode is correspondingly a cathode or an anode. The material of the luminescent material layer 4 is an electroluminescent material, and the electroluminescent material is a material that directly converts electric energy into light energy by means of the excitation of a current and an electric field under the action of a direct current (DC) electric field or an alternating current (AC) electric field, i.e., the luminescent material layer 4 is driven by the voltage between the first electrode layer 2 and the second electrode layer 5 to emit light and to realize display. The packaging layer 6 is a functional layer for waterproof, dustproof, and corrosion protection. The packaging layer 6 may be a single layer, such as an organic layer, or may include a plurality of layers, such as a first inorganic dielectric layer, an organic layer, and a second inorganic dielectric layer.

The pixel definition layer 3 is a functional layer for defining pixel positions and forming pixel pits. The first portion 31 of the pixel definition layer 3 is the portion corresponding to the active area of the display panel, and the first portion 31 is provided with pixel pits for evaporating luminescent material to form pixels. The second portion 32 is the portion surrounding the first portion 31 and corresponding to a non-active area of the display panel. In the related art, the second portion 32 is a thin film in a leveling state. In the embodiments of the present disclosure, a depression structure 321 is arranged in the second portion 32 at a side of the pixel definition layer 3 away from the array substrate 1, i.e., an opening direction of the depression structure 321 is the same as an opening direction of the pixel pit. The depression structure 321 surrounds the first portion 31 and is in contact with the second portion 32, i.e., the depression structure 321 is arranged in a peripheral edge area in contact with the active area of the pixel definition layer 3. A depth and a width of the depression structure 321 may be a suitable value set in accordance with a thickness of the pixel definition layer 3, a depth of the pixel pit, or a molding process.

According to the display panel in the embodiments of the present disclosure, the depression structure 321 is arranged in the second portion 32 of the pixel definition layer 3 and the second portion 32 is in the peripheral edge area of the active area. In this regard, during an evaporation of the luminescent material, although the luminescent material is evaporated on the pixel definition layer 3 through an aperture of the FMM located in the periphery of the active area, due to the arrangement of the depression structure 321, this part of the luminescent material is accommodated in the depression structure 321, so that when different FMMs are replaced to evaporate luminescent materials of different colors, it is able to prevent the FMM from taking away the luminescent material located in the periphery of the active area and bringing the same into the active area of the display panel, thereby avoiding occurrence of foreign matters in the display panel.

Figure 3:
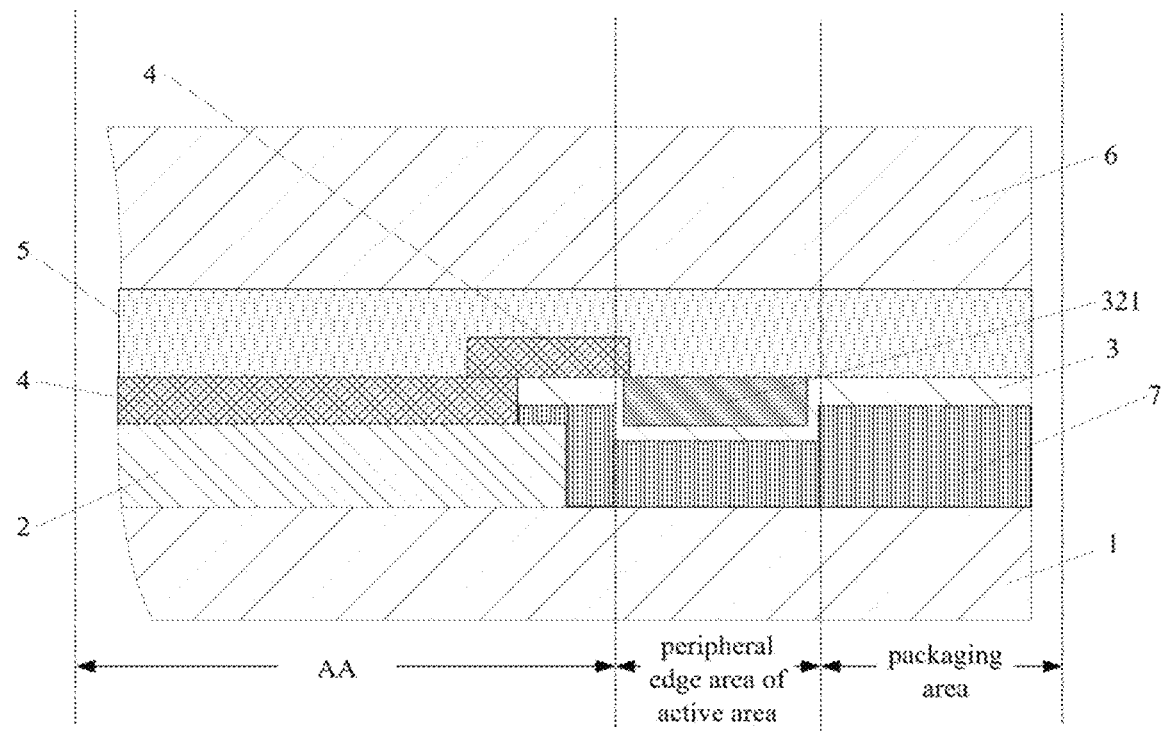
FIG. 3 is another sectional view of a display panel according to one embodiment of the present disclosure.

In a possible embodiment of the present disclosure, as shown in FIG. 3, the display panel further includes a planarization layer 7. The planarization layer 7 is arranged between the first electrode layer 2 and the pixel definition layer 3. The planarization layer is provided with a groove of which an opening is oriented to the pixel definition layer 3. A surface of the groove is covered with the pixel definition layer 3 to form the depression structure 321.

Specifically, a thickness and a material of the planarization layer may refer to those in the art, and thus will not be particularly defined herein. The groove defined in the planarization layer may be realized by means of exposure, etching, or engraving when the planarization layer is molded. The groove in the planarization layer may be defined through the planarization layer or may be a non-through groove similar to a blind hole. In this regard, the groove may be directly covered with the second portion 32 of the pixel definition layer 3, thereby forming the depression structure 321.

In a possible embodiment of the present disclosure, a longitudinal section of the depression structure shown in FIG. 1 is of a rectangular shape.

Specifically, the depression structure 321 is formed in the pixel definition layer 3, so the depression structure 321 may be formed together with the pixel pit. Referring to an existing process, and considering accommodation performance of the depression structure 321 for the luminescent material, a longitudinal section of the depression structure 321 may be of a rectangular shape. The longitudinal section is a section with a plane perpendicular to the pixel definition layer 3 and perpendicular to a length direction of the depression structure 321.

Further, a depth of the depression structure 321 is 0.1 μm to 1.8 μm.

Specifically, considering the depth of the pixel pit, the depth of the depression structure 321 is 0.1 μm to 1.8 μm as described above, or the depth of the depression structure 321 is 0.7 μm to 1.8 μm, and in a possible embodiment of the present disclosure, the optional depth value is 0.7 μm. The depth meets the requirement for accommodating the luminescent material.

Still further, a width of the depression structure in a direction away from the active area is 0.3 mm to 0.5 mm.

Specifically, the depression structure 321 is not only able to accommodate the luminescent material, but also is provided with a sufficient width, to accommodate all the luminescent material corresponding to the aperture area in the periphery of the active area of the FMM, so as to sufficiently avoid the problem that when the FMM is replaced for evaporating the luminescent material, the FMM is in contact with the luminescent material previously evaporated on the pixel definition layer 3, thereby completely avoiding the occurrence of foreign matters into the display panel.

In a possible embodiment of the present disclosure, the width of the depression structure 321 is 0.3 mm.

In a possible embodiment of the present disclosure, a plurality of barriers is arranged in an annular depression structure 321 and is spaced apart from each other, and the barriers have a predetermined thickness.

Figure 4:
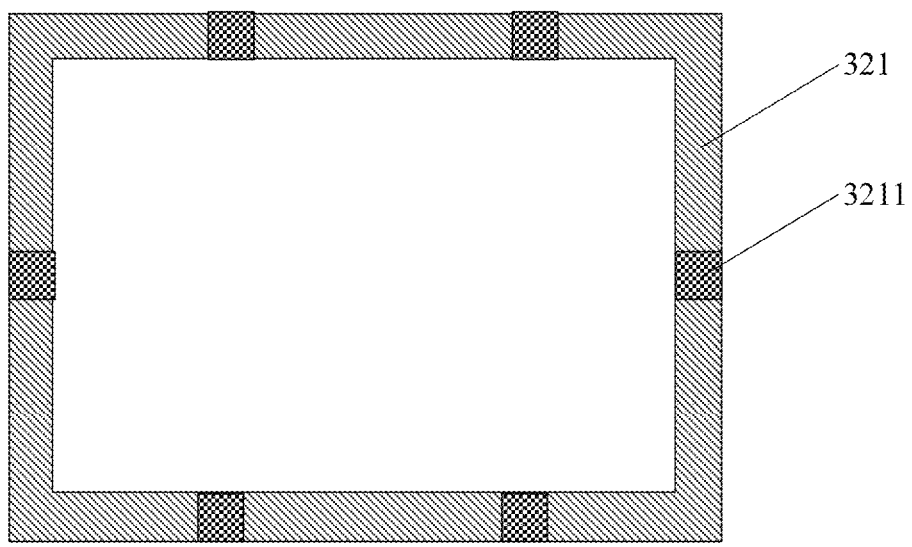
FIG. 4 is a top view of a depression structure according to one embodiment of the present disclosure.

Specifically, it should be appreciated that, the depression structure 321 is a groove structure with an annular shape, and a plurality of barriers 3211 is arranged in the depression structure 321 and is spaced apart from each other, as shown in FIG. 4, the overall strength of the depression structure 321 is increased. A thickness of the barrier 3211 may be the same as the depth or width of the depression structure 321, or determined in accordance with an actual production process. For example, the thickness of the barrier 3211 may be less than the depth of the depression structure 321, e.g., when the depth of the depression structure 321 is 0.7 μm, the thickness of the barrier 3211 may be 0.5 μm.

Figure 5:
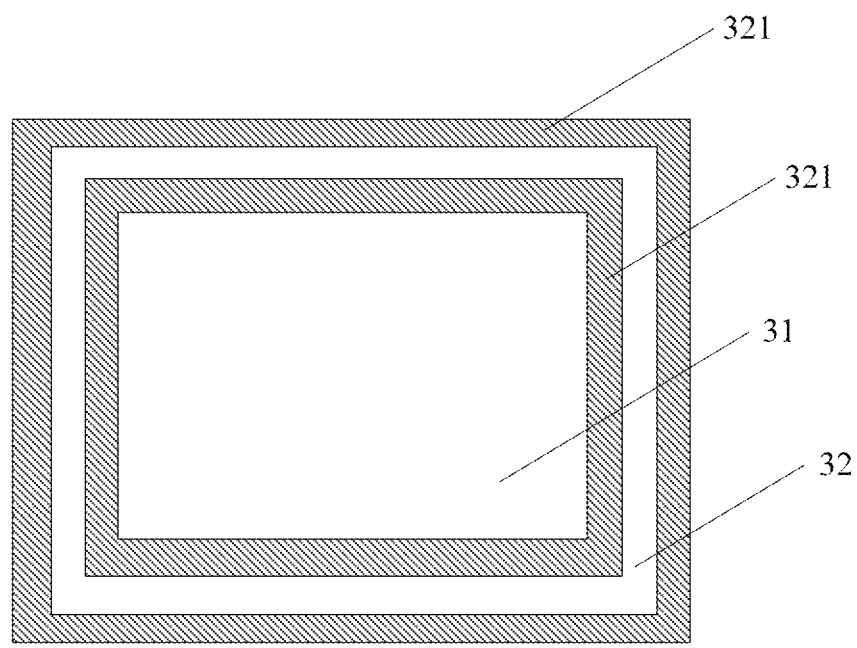
FIG. 5 is a top view of another depression structure according to one embodiment of the present disclosure.

In a possible embodiment of the present disclosure, the number of the depression structures 321 may be two or more, and the two or more depression structures 321 are spaced apart from each other in the second portion in a direction from the first portion to the second portion, as shown in FIG. 5.

As shown in FIG. 1 and FIG. 2, the present disclosure further provides in some embodiments a display device, including a display panel. The display panel includes an array substrate 1, a first electrode layer 2, a pixel definition layer 3, a luminescent material layer 4, a second electrode layer 5 and a packaging layer 6 laminated one on another.

The pixel definition layer 3 includes a first portion 31 and a second portion 32. The first portion 31 corresponds to and is arranged in an active area of the display panel. The second portion 32 surrounds the first portion 31. A depression structure 321 is arranged in the second portion 32. An opening of the depression structure 321 is oriented to a side of the pixel definition layer 3 away from the array substrate 1. The depression structure 321 surrounds the first portion 31 and is in contact with the first portion 31.

Specifically, the display device may be a display screen merely with a display function or a display screen with a touch function. The display panel in this embodiments may directly use the display panel in the above embodiments. The specific implementation structure may refer to that mentioned hereinabove, and thus will not be particularly defined herein.

According to the display panel included in the display device in the embodiments of the present disclosure, the depression structure 321 is arranged in the second portion 32 of the pixel definition layer 3 and the second portion 32 is the peripheral edge area of the active area. In this regard, during an evaporation of the luminescent material, although the luminescent material is evaporated on the pixel definition layer 3 through an aperture of the FMM located in the periphery of the active area, due to the arrangement of the depression structure 321, this part of the luminescent material is accommodated in the depression structure 321, so that when different FMMs are replaced to evaporate luminescent materials of different colors, it is able to prevent the FMM from taking away the luminescent material located in the periphery of the active area and bringing the same into the active area of the display panel, thereby avoiding the occurrence of foreign matters in the display panel.

It should be appreciated that, related features in the above devices may be cross-referenced. In addition, such words as "first" and "second" in the above embodiments are used to differentiate each embodiment, and do not represent the advantages and disadvantages of each embodiment.

In the above description, numerous specific details are described. However, it is should be appreciated that, embodiments of the present disclosure may be implemented without these specific details. In some instances, well-known structures and techniques are not shown in detail, so as not to obscure the understanding of the description.

Similarly, it should be appreciated that, in the above description of the embodiments of the present disclosure, various features of the present disclosure are grouped together in a single embodiment, drawing, or description thereof for the purpose of streamlining the present disclosure and supporting the understanding of one or more of the embodiments of the present disclosure. However, the devices in the embodiments of the present disclosure should not be interpreted as reflecting an intention that the claimed present disclosure requires more features than are expressly recited in each claim. Rather, as reflected in the claims, inventive aspects is less than all the features of the single embodiment disclosed above. Therefore, the claims following the specific embodiment are hereby expressly incorporated into the specific embodiment, wherein each claim itself is a separate embodiment of the present disclosure.

The above embodiments are for illustrative purposes only, but the present disclosure is not limited thereto, modifications and improvements without departing from the spirit of the present disclosure shall also fall within the scope of the present disclosure.

What is claimed is:

1. A display panel, comprising: an array substrate, a first electrode layer, a pixel definition layer, and a luminescent material layer laminated one on another;

wherein the pixel definition layer includes a first portion and a second portion, the first portion corresponds to and is arranged in an active area of the display panel, the second portion surrounds the first portion, a depression structure is arranged in the second portion, and an opening of the depression structure is oriented to a side of the pixel definition layer away from the array substrate;

wherein the depression structure surrounds the first portion and is in contact with the first portion.

2. The display panel according to claim 1, further comprising a planarization layer;

wherein the planarization layer is arranged between the first electrode layer and the pixel definition layer; the planarization layer is provided with a groove of which an opening is oriented to the pixel definition layer; a surface of the groove is covered with the pixel definition layer; and an orthogonal projection of the depression structure onto the array substrate is within an orthogonal projection of the groove onto the array substrate.

3. The display panel according to claim 1, wherein a plurality of barriers is arranged in the depression structure which is annular, and is spaced apart from each other;

wherein a thickness of the barrier is the same as a depth of the depression structure, or the thickness of the barrier is less than the depth of the depression structure.

4. The display panel according to claim 1, wherein there are two or more depression structures, and the two or more depression structures are spaced apart from each other in the second portion in a direction from the first portion to the second portion.

5. The display panel according to claim 1, wherein the display panel further includes: a second electrode layer arranged at a side of the luminescent material layer away from the array substrate; and a packaging layer arrange at a side of the second electrode layer away from the array substrate.

6. A display device, comprising:
a display panel;
wherein the display panel includes: an array substrate, a first electrode layer, a pixel definition layer, and a luminescent material layer laminated one on another;
wherein the pixel definition layer includes a first portion and a second portion, the first portion corresponds to and is arranged in an active area of the display panel, the second portion surrounds the first portion, a depression structure is arranged in the second portion, and an opening of the depression structure is oriented to a side of the pixel definition layer away from the array substrate;
wherein the depression structure surrounds the first portion and is in contact with the first portion, or, a section of the depression structure in a direction perpendicular to a display surface of the display panel is of a rectangular shape.

7. The display device according to claim 6, further comprising a planarization layer;
wherein the planarization layer is arranged between the first electrode layer and the pixel definition layer; the planarization layer is provided with a groove of which an opening is oriented to the pixel definition layer; a surface of the groove is covered with the pixel definition layer; and an orthogonal projection of the depression structure onto the array substrate is within an orthogonal projection of the groove onto the array substrate.

8. The display device according to claim 6, wherein a depth of the depression structure is 0.1 μm to 1.8 μm.

9. The display device according to claim 8, wherein a depth of the depression structure is 0.7 μm to 1.8 μm.

10. The display device according to claim 6, wherein a width of the depression structure in a direction away from the active area is 0.3 mm to 0.5 mm.

11. The display device according to claim 10, wherein the width of the depression structure is 0.3 mm.

12. The display device according to claim 6, wherein a plurality of barriers is arranged in the depression structure which is annular, and is spaced apart from each other;
wherein a thickness of the barrier is the same as a depth of the depression structure, or the thickness of the barrier is less than the depth of the depression structure.

13. A display panel, comprising: an array substrate, a first electrode layer, a pixel definition layer, and a luminescent material layer laminated one on another;
wherein the pixel definition layer includes a first portion and a second portion, the first portion corresponds to and is arranged in an active area of the display panel, the second portion surrounds the first portion, a depression structure is arranged in the second portion, and an opening of the depression structure is oriented to a side of the pixel definition layer away from the array substrate;
wherein a section of the depression structure in a direction perpendicular to a display surface of the display panel is of a rectangular shape.

14. The display panel according to claim 13, wherein a depth of the depression structure is 0.1 μm to 1.8 μm.

15. The display panel according to claim 14, wherein a depth of the depression structure is 0.7 μm to 1.8 μm.

16. The display panel according to claim 13, wherein a width of the depression structure in a direction away from the active area is 0.3 mm to 0.5 mm.

17. The display panel according to claim 16, wherein the width of the depression structure is 0.3 mm.

* * * * *